United States Patent [19]

Underwood

[11] Patent Number: 4,745,630
[45] Date of Patent: May 17, 1988

[54] MULTI-MODE COUNTER NETWORK

[75] Inventor: George D. Underwood, Inglewood, Calif.

[73] Assignee: Hughes Aircraft Company, Los Angeles, Calif.

[21] Appl. No.: 875,895

[22] Filed: Jun. 18, 1986

[51] Int. Cl.$^4$ ................ G06F 11/00; H03K 21/40
[52] U.S. Cl. ........................... 377/29; 377/33; 377/44; 377/55; 377/56
[58] Field of Search ............ 377/28, 27, 29, 111, 377/114, 115, 116, 67, 70, 54, 55, 56, 33, 44

[56] References Cited

U.S. PATENT DOCUMENTS

| | | | |
|---|---|---|---|
| 3,761,695 | 9/1973 | Eichelberger | 371/25 |
| 4,621,201 | 11/1986 | Amdahl et al. | 324/73 R |
| 4,630,270 | 12/1986 | Petit et al. | 324/73 R |
| 4,636,716 | 1/1987 | Welzhofer | 324/73 R |

*Primary Examiner*—John S. Heyman
*Attorney, Agent, or Firm*—C. D. Brown; A. W. Karambelas

[57] ABSTRACT

A multi-mode counter network and a method of testing the operation of the multi-mode counter network are disclosed. The multi-mode counter network comprises a counter circuit formed of a plurality of counter registers and a multiplexer circuit formed of a plurality of multiplexers wherein said multiplexers are connected to and associated with one of the registers and are operative to selectively vary the input signal communicated to the associated register such that the registers operate in one of a plurality of operational modes. By controlling the selection of the input signal communicated to the registers the network may be alternately configured to perform traditional counting functions or may be configured to provide a serial signal path for communicating a test pattern through the registers and multiplexers to test the operation of the multiplexers and registers. The test pattern is communicated through the circuit, bypassing counter enabling circuitry, and thus independent of the network counter rate.

22 Claims, 1 Drawing Sheet

MULTI-MODE COUNTER NETWORK

STATEMENT AS TO RIGHTS TO INVENTIONS MADE UNDER FEDERALLY-SPONSORED RESEARCH AND DEVELOPMENT

The government has rights in this invention pursuant to Purchase Order No. E31011L, under Contract No. F33615-83-C-0043, awarded by the Department of the Air Force.

CROSS REFERENCE TO A RELATED APPLICATION

This application is related to U.S. application Ser. No. 875,894, titled Look Ahead Terminal Counter, filed concurrently herewith by the same inventor.

BACKGROUND OF THE INVENTION

The present invention relates to counters and, more particularly, to a multi-mode network operative to utilize counter circuitry to perform a variety of functions.

Generally, a counter is a device capable of changing from one to another distinguishable state. Counters are operative to change states, and thereby produce one or more output signals, upon receipt of some predetermined number of input pulses. A plurality of counter states are frequently cascaded together to perform digital counting. A component such as a register is used to generate and store counter output signals representative of the number of input pulses, or the number of occurrences of a particular event of interest. Outputs from the registers can be connected to associated combinational logic that is constructed to generate a state decode output signal when the register outputs are at predetermined states, e.g., when all the register outputs are at a one state, commonly known as terminal count. It is to be understood, however, that different combinational logic can be used to generate a state decode output signal when the register outputs are at any predetermined state.

Thus, as used hereinafter, the signal terminal count (TC) shall be used generally to represent a state decode output signal generated in response to register outputs at any predetermned state.

Counters are frequently used in computer networks, in combination with a variety of different types of combinational logic to perform numerical functions that allow the computer to solve problems relating to combinations, permutations and/or selection of discrete data from a large pool of input data.

For example, various types of combinational logic may be interconnected with counter networks to analyze the various ways in which discrete objects may be combined and permuted. One might wish to select r objects from n distinct objects for repetitive selection of the same object. In less technical terms, the combinational logic and an associated counter network can operate to sort a large volume of input data into definable groups having some common characteristics. One such application would be to segregate components of radar return signals indicative of the presence of a moving target, or to segregate incident x-ray signals having signal components representative of the existence of cancerous growths in a patient. Such applications typically require a generation of complex signals representative of numerical functions, combination of input data with those functions and an analysis of the recurrence of predetermined signal patterns within the combination. Circuitry to perform those functions includes complex combinational logic and an extended number of counters operatively associated with that combinational logic.

Frequently counter networks and combinational logic are not segregatable with respect to testing procedures such that it is impossible to differentiate between a failure in the combinational logic and a failure in the counter network. Moreover, a plurality of counter stages may be "buried" within a larger circuit such that it is almost impossible to identify where any failure may be located. Additionally, where the counter must be sequenced through its entire operational cycle to generate an output signal, the time necessary to perform such a test may be unacceptably long and the information obtained from the test procedure may be limited to simple determination of whether the overal network performs as desired, without any differentiation regarding the source of any failure. Furthermore, as explained below, such a test will not necessarily identify failures that may appear at states other than the final state of the counter network. Consequently, the information obtained from such contemporary testing procedures is too little, and the time necessary to obtain that information is too long.

In order to facilitate the testing of counters utilized in digital processing systems it is customarily necessary to apply a large number of clock pulses to the counter circuit and determine whether counter signals are being correctly generated in response to the appropriate number of clock pulses. In some cases it may be sufficient to confirm that the terminal count output of the counter network occurs after the correct number of clock pulses, i.e. that the counter network generates a terminal count output signal at the counter network cycle rate. However, as is well understood by those familiar with counter networks, a check of only the terminal count output signal does not insure that each individual counter register is operating correctly. This failure of individual counter register may result in the loss of information from combinational logic associated with an inoperative counter register, and the loss of intermediate output signals from the counter network. Such failures may, for example, occur where the output of one or more counter registers is stuck at a high level, and may not be detectable by a simple examination of the terminal count output of the counter network. Accordingly, it is frequently necessary to examine the output of each individual counter register after each clock pulse during one cycle. This procedure may be not only time consuming, but may also require an inordinate amount of dedicated storage and comparison circuitry. Where a plurality of counter stages are cascaded it is even more time consuming to compare the state of each counter register with the expected state after each clock pulse and counter enable pulses associated with a cycle of the counter, i.e. network cycle time.

Aside from failures associated with stuck counter registers, failures may result where the counter network, though operative to properly effect state changes in response to input signals, fails to enable generation of a terminal count signal soon enough after the appropriate clock pulse. Such failures are commonly referred to as race conditions. Other failures occur where, due to transient conditions within the counter network, a terminal count signal is generated at an inappropriate time. A brief explanation of how such false terminal count signals may be generated is believed to be useful for a more complete understanding of the present invention.

As previously indicated a counter network typically operates to generate a terminal count signal each time the counter network sequences through a predetermined number of clock pulses. After each counter register is sequenced to a desired output state, logic forming a portion of the counter network recognizes the existence of the desired state condition at each counter register and enables generation of a terminal count signal upon occurrence of the next clock pulse. Difficulties arise where, due to factors such as inherent propagation delays in the circuit components, the output state of the counter registers may briefly be in a state that enables the generation of a terminal count signal, though the counter has not yet received the desired number of input pulses. Consequently, if the next clock pulse occurs prior to the time the counter registers have completed transitioning to states corresponding to the current count, a false terminal count signal may be generated from the counter.

Thus, in addition to providing an improved technique for testing the operation of the counter and associated combinational logic the present invention is also directed to circuitry for reducing counter propagational delays and eliminating false output signals, associated with terminal count, as described more fully below.

Accordingly, the present invention is directed to a counter wherein each counter register may be separately tested without the need to sequence all counter registers and counter enable circuitry through the number of clock pulses corresponding to the network cycle time. The present invention further provides a counter network wherein an error may be resolved to a specific register or to combinational logic associated with a specific register. The present invention also provides a counter network wherein propagation delays and false output signals associated with terminal count can be reduced or eliminated. The counter network of the present invention is also intended to permit operation of the counter in a plurality of modes including a counting mode, a testing mode, a hold mode, a clear mode and a data loading mode, thereby rendering the counter network more versatile, more testable and more reliable.

SUMMARY OF THE INVENTION

A multi-mode counter network and a method of testing the operation of the multi-mode counter network are disclosed. The multi-mode counter network comprises a counter circuit formed of a plurality of counter registers and a multiplexer circuit formed of a plurality of multiplexers wherein each of the multiplexers are connected to an associated one of the registers and are operative to selectively vary the input signal communicated to the associated register such that the registers operate in one of a plurality of operational modes. By controlling the selection of the input signal communicated to the register the network may be alternately configured to perform traditional counting functions or may be configured to provide a serial signal path for communicating a test pattern through the registers and multiplexers to test the operation of the multiplexers, registers and associated combinational logic. The test pattern may be communicated through the circuit, by-passing count enabling circuitry and parallel loading functions, and thus independent of the traditional counter controls and counter network cycle time, i.e. the time necessary for the counter to transition through a complete cycle. Alternatively, a test pattern can be serially shifted to a desired portion of the counter; then the circuit may be allowed to operate on a desired segment of input data; and the result of that operation captured within the counter network and then serially shifted out. Thus, the operation of combinational logic or other circuitry may be selectively tested via the combined operation of the counter testing and loading modes.

In the presently preferred embodiment the multiplexers are also operative to communicate inputs to the associated registers to hold the output of the registers at their current level, to parallel load data into the registers or to set the output of the registers at a predetermined level.

Look ahead terminal count enable circuitry is also provided to reduce delay time between the occurrence of a desired number of input signals and the resulting generation of a terminal count output signal. The terminal count enable circuitry is also operative to isolate spurious conditions within the network from the counter output.

DETAILED DESCRIPTION OF THE PRESENTLY PREFERRED EMBODIMENT

Figure 1:
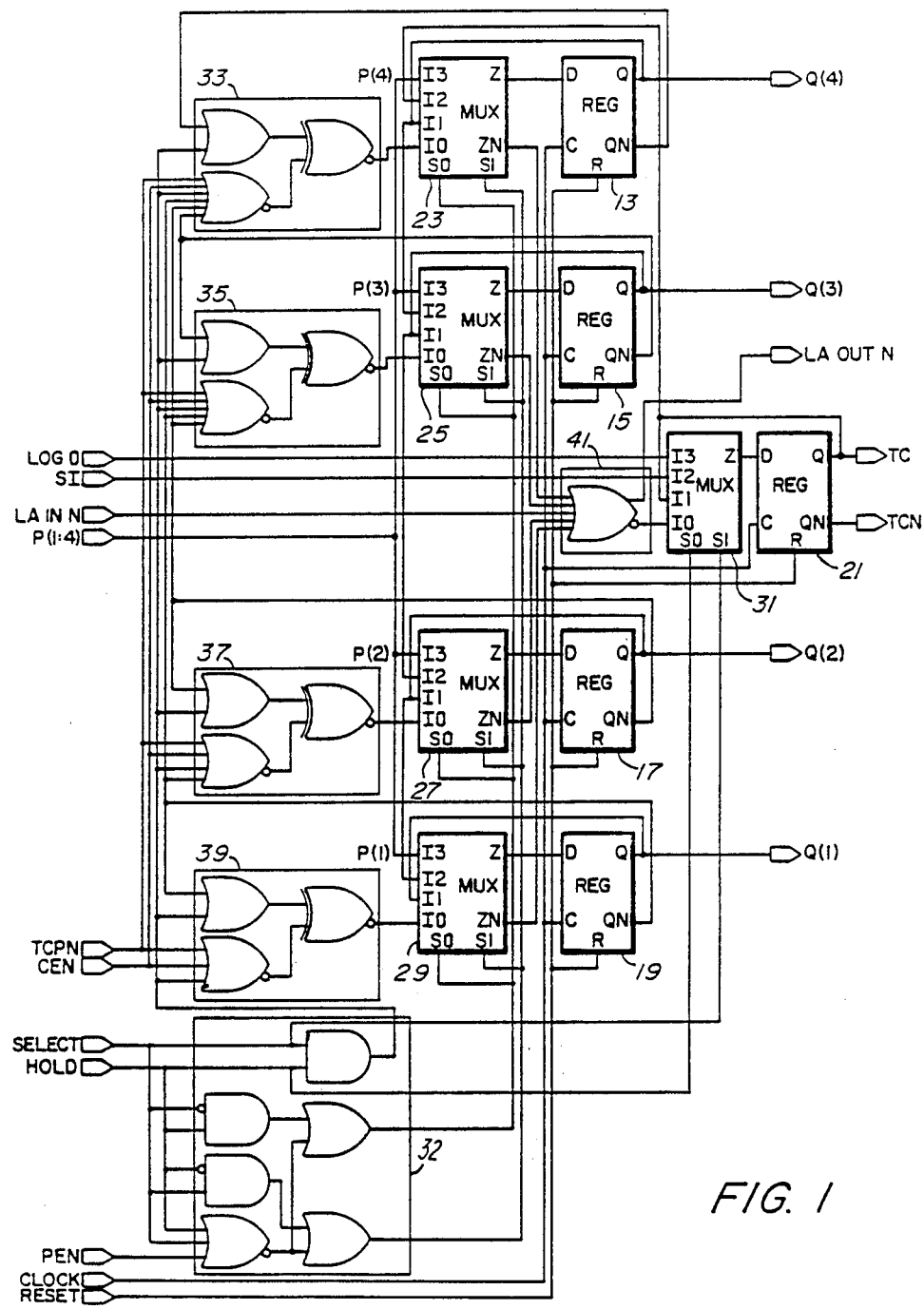
FIG. 1 is the circuit diagram illustrating the presently preferred embodiment.

The detailed description set forth below in connection with the appended tables and drawing is intended merely as a description of the presently preferred embodiment of the invention, and is not intended to represent the only form in which the present invention may be constructed or utilized. The description sets forth the functions and sequence of events that are affected by the invention in connection with the illustrated embodiment. It is to be understood, however, that the same, or equivalent functions and sequences may be accomplished by different embodiments that are also intended to be encompassed within the spirit and scope of the invention.

Referring to FIG. 1, an exemplary circuit is illustrated for providing the structure and functions of the present invention. An identification of the signals illustrated at FIG. 1 is provided in Table I, below.

TABLE I

| IDENTIFICATION OF SIGNALS | | |
|---|---|---|
| NAME | | FUNCTION |
| LOG 0 | Logic Zero | Control function to clear or set terminal counter |
| SI | Serial Input | Test input stream |
| LA IN N | Look Ahead In Not | Look ahead signal from preceeding stage |
| P(1:4) | Parallel Input Signal | Four parallel input signals |
| TCPN | Terminal Count Prior Not | complimentary terminal count from preceeding stage |
| CEN | Count Enable Not | complimentary counter enable signal |
| SELECT | Select | Select input to multiplexers |
| HOLD | Hold | Hold counter |
| PEN | Parallel Enable Not | complimentary parallel load enable signal |
| CLOCK | Clock | Timing signal |
| RESET | Reset | Reset asyncronous flip-flops |
| Q(1)–Q(4) | Counter Register Outputs | Counter register outputs |
| LA OUT N | Look Ahead Output | complimentary look ahead |

TABLE I-continued

| IDENTIFICATION OF SIGNALS | |
|---|---|
| NAME | FUNCTION |
| Not | output signal |
| TC  Terminal Count | Terminal count |
| TCN  Terminal Count Not | complimentary terminal count |

As shown in FIG. 1 counter network 11 comprises a plurality of registers (REG) 13, 15, 17, 19 and 21. Each of the registers 13, 15, 17, 19 and 21 is preferably formed as a D flip-flop, and may be implemented as Model F100151 flip-flops manufactured by Fairchild Camera and Instrument Corporation.

The input to each of the registers are provided by an associated multiplexer (MUX) 23, 25, 27, 29, and 31, respectively, which may be implemented as Model F100171 multiplexers manufactured by Fairchild Instrument and Camera Corporation. As is well understood by those skilled in the art, the signal level output present at the Z output of each of the multiplexers is clocked into the associated register by the signal CLOCK, applied to the C input to the register. Consequently, the signal level present at the Z output of each of the multiplexers appears at the Q output of the associated register following the next CLOCK pulse. The time delay between the appearance of a signal level at the multiplexer Z output and the appearance of a corresponding signal at the Q output of the associated register is determined by two principal factors, i.e., the delay between the appearance of the multiplexer output and the occurrence of the next succeeding clock pulse, and the internal propagation delay of the register.

Each of the multiplexers 23, 25, 27, 29 and 31 is provided with a plurality of input ports I0, I1, I2, and I3. The multiplexers are controllable to communicate the signal on the selected one of the four input ports to the Z output of the multiplexer, in response to the control signals S0 and S1. Control signals S0 and S1 are generated by logic circuitry 32 in response to the externally generated signals SELECT, HOLD and PEN, as set forth below at Tables II, III and IV. Logic circuitry 32 is operative to translate the SELECT, HOLD, and PEN signals into appropriate S0 and S1 signals for selecting the proper input in response to the external signals.

Logic circuits 33, 35, 37, and 39 comprise counter enabling circuitry operative to sequentially provide an input to the port, I0, of multiplexers 23, 25, 27, and 29, respectively, when network 11 is operated in a counting mode. Counter enabling circuitry 33, 35, 37, and 39 cooperate with the multiplexers and registers to sequentially generate output signals from registers 13, 15, 17, and 19, respectively, upon the occurrence of a predetermined number of clock pulses. Upon proper sequencing of registers 13, 15, 17, and 19 then, register 21 is enabled, ultimately resulting in the generation of a terminal clock signal TC at the Q output of register 21.

Terminal count output enabling circuitry 41 is preferably formed as an or/nor gate connected to the complementary outputs (ZN) of multiplexers 23, 25, 27, and 29. Connection to the ZN outputs causes terminal count output enabling circuitry 41 to communicate an enable signal to the I0 input of multiplexer 31 when all of the ZN terminals are in a zero state, i.e. upon the occurrence of the clock pulse preceding the clock pulse generating the terminal count signal. Consequently, the Z output of multiplexer 31 and, therefore, the D input to register 21, are enabled in response to the clock pulse immediately preceeding the clock pulse that generates the terminal count signal. Upon the occurrence of the next CLOCK pulse the register 21 is caused to generate a terminal count (TC) signal. By use of terminal count output enabling circuitry 41 a look ahead terminal count scheme is effected such that the generation of the terminal count signal TC is delayed beyond the occurrence of the corresponding clock pulse signal by only the time corresponding to the propagation delay inherent in the operation of register 21. It is to be understood that by varying the circuitry used to form terminal count output enabling circuitry 41, or the connections thereto, a similar look ahead terminal count scheme may be effected to correspond with the generation of a terminal count signal in response to any predetermined number of clock pulses.

Moreover, the inclusion of register 21 prevents the generation of false terminal count signals where terminal count output enabling circuitry 41 generates a terminal count enable signal at the I0 port of multiplexer 31 in response to transient conditions of multiplexers 23, 25, 27 and 29. For example, as network 11 transitions from a count of 1101 to 1110 there may be a brief moment where the count will appear as 1111, resulting in a 0000 input to terminal count output enabling circuitry 41 and the consequent generation of a terminal count enable signal to be communicated to the I0 port of multiplexer 31. Where network 11 is in the counting mode this condition results in communication of a terminal count enable signal to the input to register 21. However, register 21 operates to isolate such transient conditions from the output of network 11 and will only generate an output when the register is enabled at the time a CLOCK signal is received. By that time, the transient conditions should be dissipated and the multiplexers should all be transitioned to their correct state. As will be recognized by those skilled in the art, the CLOCK rate should be selected with those transient conditions in mind and should allow sufficient time for the circuit components to complete transitioning between CLOCK pulses.

The present invention permits the counter network 11 to be tested without sequencing the registers and associated combinational logic through the entire network cycle. By controlling the state of S0 and S1, the test pattern input from the SI terminal can be input to multiplexer 23, and serially communicated through the remaining multiplexers and registers independent of the rate at which the terminal count signal is generated.

In the presently preferred embodiment a test pattern may be communicated from the serial input port (SI) to the test input port (I2) of multiplexer 31. When S0 and S1 are at appropriate levels each of the multiplexers 23, 25, 27, 29 and 31 will operate to output the signal present on the I2 input port of each associated multiplexer. That signal is then communicated to the D input port of the associated register. The signal is then communicated to the Q output port of that register and is, in turn, communicated to the I2 input port of another multiplexer. Thus, the output of register 21 is communicated to the I2 port of register 23. That signal is then communicated to the output of register 13 and then to the I2 input port register 25. The same signal is communicated to register 15 and then to the I2 input port of multiplexer 27. The output of register 17 is similarly communicated to the I2 input port of multiplexer 29. The output of multiplexer 29 is communicated to register 19 from which a serial output of the test pattern is discharged from terminal Q(1). Thus, the test pattern input to network 11 at terminal SI is serially communicated through each of the multiplexers and registers and is ultimately output from terminal Q(1). As noted above the rate at which the input test pattern is communicated through the multiplexers and registers is independent of the operation of the counter enabling circuitry 33, 35, 37, and 39. Accordingly, all multiplexers and registers may be tested in a convenient and expeditious manner, independent of any interconnected combinational logic or the rate at which the terminal count (TC) signal is generated, i.e. the network cycle time.

As shown at FIG. 1 test pattern outputs may also be obtained at terminals Q(2), Q(3), Q(4), and TC. Thus, the operation of each multiplexer and register pair may be independently checked. It should be noted, however, that failures may be resolved to a specific register using the serial output by shifting in predetermined data patterns, operating a count mode, shifting data through the network, and comparing the output of expected levels.

In addition to communicating the output of each register to the I2 input port of an unassociated multiplexer, the output of each register is also communicated to the I1 input port of the associated multiplexer. Upon the generation of appropriate S0 and S1 control signals (see Tables II, III and IV) each multiplexer is operative to communicate the signal appearing on the I1 input port to the associated register. Thus, the output of that register is maintained at its current level until the S0 or S1 signals change, or until the register is reset.

Counter network 11 may also operate to parallel load a plurality of data bits. In the presently preferred embodiment a plurality of data bits may be communicated to counter network 11 on the P terminal and communicated to multiplexers 23, 25, 27, and 29 at the I3 input ports of those multiplexers. Upon the appearance of appropriate PEN, SELECT and HOLD signal levels, the information appearing at the I3 input ports is communicated to the associated registers and ultimately output from the registers at the Q(1), Q(2), Q(3) and Q(4) terminals to external circuitry. Counter enabling circuitry 33, 35, 37, and 39, terminal count output enabling circuitry 41 register 21 and multiplexer 31 need not be used when the network 11 is disposed in the parallel load mode. When terminal count is parallel loaded into registers 13, 15, 17 and 19, a terminal count output signal is generated by register 21 in response to the same clock pulse used to parallel load the registers.

As mentioned above, network 11 may be used to facilitate checking the operation of external combinational logic connected to network 11. Where the output of some external combinational logic is communicated to the I3 input ports of the multiplexers for parallel loading, network 11 may be operated to input a limited amount of data from the external combinational logic, and then operated in a test mode to serially output the data trapped in the registers. Thus, the output of the external combinational logic can be held and serially output for comparison against expected levels. The operation of the external combinational logic may therefore be tested vis-a-vis the counter testing circuitry of network 11.

If desired, a plurality of counter networks 11 may be cascaded e.g., to facilitate higher order counts. In such a cascaded network the complementary terminal count signal (TCN) from the first stage serves as the complementary terminal count prior signal (TCPN) to the second stage. Similarly, the complementary look ahead output signal (LA OUT N) from the first stage serves as the complementary look ahead input signal (LA IN N) to the succeeding stage.

Similarly, the serial output signal from the Q(1) terminal of the first stage may be used as the serial input signal (SI) to the following stage. Thus, any number of stages may be cascaded without the need for external logic.

As previously discussed, various modifications, additions and substitutions may be effected to implement the structure and function of the component portions without departing from the spirit and scope of the invention. For example, other counter enabling circuitry and various alternate multiplexing schemes may be utilized to implement various counting schemes or interface various combinational logic circuitry within the scope of the invention. Additionally, it is clearly anticipated that the present invention may have application in various areas beyond those specifically addressed.

TABLE II

| | Enablement of Operational Modes | |
|---|---|---|
| SELECT | HOLD | FUNCTION |
| 0 | 0 | This is a counting or loading mode. If PEN is inactive the counter synchronously counts under the control of CEN. If PEN is active the counter will synchronously parallel load bits P(1) to P(4) where P(4) is MSB. |
| 0 | 1 | Hold mode. The counter will be held in its current state, i.e., $Q(t + 1) = Q(t)$. |
| 1 | 0 | Test mode. The counter will serial shift from the SI line through all the registers of the counter and out the Q(1) line. |
| 1 | 1 | Set mode. The counter registers will be synchronously set, e.g. to a zero state. |

TABLE III

| Selected Inputs to Multiplexers 23, 25, 27, 29 | | | | |
|---|---|---|---|---|
| SELECT | HOLD | $S_0$ (PEN = 0) | $S_1$ (PEN = 0) | INPUT |
| 0 | 0 | 1 | 1 | $I_3$ |
| 0 | 1 | 1 | 0 | $I_1$ |
| 1 | 0 | 0 | 1 | $I_2$ |
| 1 | 1 | 1 | 1 | $I_0$ |

TABLE IV

| Selected Inputs to Multiplexers 23, 25, 27, 29 | | | | |
|---|---|---|---|---|
| SELECT | HOLD | $S_0$ (PEN = 1) | $S_1$ (PEN = 1) | INPUT |
| 0 | 0 | 0 | 0 | $I_0$ |
| 0 | 1 | 1 | 0 | $I_1$ |
| 1 | 0 | 0 | 1 | $I_2$ |
| 1 | 1 | 0 | 0 | $I_0$ |

What is claimed is:
1. A multi-mode counter network (11) comprising:
a plurality of registers (13, 15, 17, 19 and 21), each of said plurality of registers having an input port and an output port;
a plurality of multiplexers (23, 25, 27, 29 and 31), each of said multiplexers having a plurality of input ports and output ports, each of said multiplexers having an output port connected to an input port of an associated one of said plurality of registers, said multiplexer input ports including a counting input port and a testing input port;

counter enable circuitry (33, 35, 37 and 39) connected to the counting input port (I0) of at least one of said multiplexers;

a test pattern data stream input port (SI) connected to the testing input port (I2) of at least one of said multiplexers; and multiplexer control logic circuitry (32) selectively controlling said multiplexers so that selected input ports of each multiplexer are connected to that multiplexer's output port and thereby to the input port of said associated one of the plurality of registers so that said multiplexers operate in one of a plurality of operational modes, said operational modes including a counting mode wherein multiplexers are controlled to connect the counter enable circuitry to the plurality of registers for the purpose of generating a counter output signal at a predetermined counter cyce rate, and also including a testing mode wherein the plurality of multiplexers are controlled to connect the test pattern data stream input port to the plurality of registers for the purpose of serially shifting a test pattern through said plurality of registers.

2. The network as recited in claim 1 wherein an output port of a first one of said plurality of registers is connected to the testing input port of a multiplexer associated with a second one of said plurality of registers.

3. The network as recited in claim 2 wherein said plurality of registers and said multiplexers are serially interconnected when said multiplexers are controlled to operate in said testing mode.

4. The network as recited in claim 3 further comprising:

a network test pattern for application to said network test pattern input port; and a network test pattern output port for outputting the test pattern, said test pattern output port being an output port of a third one of said plurality of registers.

5. The network as recited in claim 4 wherein said said test pattern is serially communicated through said network at a rate independent of said predetermined counter cycle rate.

6. The network as recited in claim 1 wherein each of said plurality of multiplexers further includes a hold input port;

and wherein said multiplexer control logic circuitry causes said hold input port (I1) of each multiplexer to be connected to the output port of the same multiplexer so that the output of said associated one of said plurality of registers is held at its current level and so that the network is operated in a hold mode when said multiplexer hold input port is connected to said register input port.

7. The network as recited in claim 1 further comprising:

an intermediate test pattern output port connected to the output port of a second one of said plurality of registers.

8. The network as recited in claim 1 further comprising:

mode control circuitry connected to said multiplexers for controlling the input to said plurality of registers in response to external control signals.

9. The network as recited in claim 1 wherein said counter enabling circuitry includes terminal count enabling circuitry connected to the counting input port of a one multiplexer and adapted to generate a terminal count enable signal in response to the presence of predetermined signals at output ports of a plurality of said multiplexers.

10. The network as recited in claim 9 wherein said one multiplexer communicates said terminal count enable signal to the input port of its associated one of said plurality of registers prior to the occurrence of a terminal count clock pulse.

11. The network as recited in claim 1 wherein said multiplexers further include a load input port (I3), and wherein said network further comprises:

parallel load input circuitry for communicating data signals to said load input ports of said multiplexers.

12. The network as recited in claim 11 wherein said multiplexers are operative to connect said load input port to the input port of an associated one of said plurality of registers so that the network is operated in a load mode.

13. A method of testing the operation of a counter network which generates output signals at a predetermined counter cycle rate, the counter network having a plurality of registers and a like plurality of multiplexers, each of said plurality of multiplexers having a plurality of input ports including a counter input port and a test pattern input port and also having an output port connected to an input port of an associated one of the like plurality of registers, said method comprising:

selectively connecting in response to a first control condition a counter enable signal to each of said counter input ports of said plurality of multiplexers upon the occurrence of predetermined number of clock pulses;

selectively connecting in response to a second control condition a test input signal to the test pattern input port of one of said plurality of multiplexers;

selectively connecting in response to the second control condition a signal output of each of said plurality of registers to said test input port of an associated one of said plurality of multiplexers;

selectively connecting in response to the second control condition a signal output of at least one of said plurality of registers to a test pattern output port;

selectively connecting in response to the first control condition a signal output of at least one of said plurality of registers to a counter output port; and selectively establishing the first control condition so that said plurality of registers operate in a counting mode, and establishing the second control condition so that the plurality of registers operates in a testing mode.

14. The method as recited in claim 13 further comprising the step of serially communicating said test input signal through each of said plurality of registers when said network is operated in said testing mode.

15. The method as recited in claim 14 further comprising the step of serially communicating said test input signal through said plurality of registers at a rate independent of said predetermined counter cycle rate.

16. The method as recited in claim 13 further comprising:

selectively connecting in response to a third control condition the input ports of said plurality of multiplexers to the output ports of the plurality of registers so that the signal output of the plurality of registers is held the same; and selectively establishing the fourth control condition.

17. The method as recited in claim 13 further comprising:

selectively connecting in response to a fourth control condition the input ports of the plurality of multiplexers to parallel data input lines so that data is loaded in parallel into the plurality of registers; and selectively establishing the fourth control condition.

18. The method as recited in claim 16 further comprising:

selectively connecting in response to the fourth control condition the output port of each of a plurality of said plurality of registers to an associated test output port.

19. A method of testing the operation of a counter network which generates output signals at a predetermined counter cycle rate, the counter network having a plurality of multiplexers each of which has an associated one of a like plurality of registers, said method comprising:

providing a counter enable signal at each counter input port of the plurality of multiplexers upon the occurence of predetermined numbers of clock pulses;

connecting a test pattern signal to a test input port of a first one of said plurality of multiplexers;

connecting a signal output of each of the plurality of said registers to a test input port of an associated one of the plurality of multiplexers;

connecting a signal output of at least one of said plurality of registers to a test pattern output port;

connecting a parallel data input signal to load input ports of each of the plurality of multiplexers;

loading a predetermined data pattern into the plurality of registers;

operating the plurality of multiplexers in a test mode to load a test pattern into the plurality of registers and to serially shift both the test pattern and data pattern through the plurality of registers; and outputting the serially shifted data pattern from the test pattern output port.

20. A testable counter comprising:

a plurality of registers each having an input port and a clock port and an output port;

a like plurality of multiplexers selectively controllable for gating signals from the output ports of the plurality of registers to the input ports of the plurality of registers in cascade so that the plurality of registers function as a counter responsive to a clock signal received at the clock ports, and for alternatively gating a test signal to the input port of a first one of the plurality of registers and gating the signal at the output port of said first register to the input port of a second register so that said plurality of registers and said plurality of multiplexers are serially interleaved to shift a serial test data pattern in response to the clock signal; and control circuitry (32) for controlling the plurality of multiplexers to gate signals so that the plurality of registers function as a counter, or else for alternatively controlling the plurality of multiplexers to gate signals so that the plurality of registers are shifting the serial test data pattern.

21. The testable counter according to claim 20:

wherein the plurality of multiplexers are also controllable for gating the output ports of the plurality of registers to the input ports of the plurality of registers so that the same count will be held within the registers upon each receipt of the clock signal; and wherein the control circuitry is further operative to control the plurality of multiplexers to gate signals so that the plurality of registers successively hold the same count.

22. The testable counter according to claim 20:

wherein the plurality of multiplexers are also controllable for gating a parallel test data pattern to the input ports of the plurality of registers; and wherein the control circuitry is further operative to control the plurality of multiplexers to gate the parallel test data pattern to the plurality of registers.

* * * * *